United States Patent [19]
Yoo et al.

[11] Patent Number: 6,056,783
[45] Date of Patent: *May 2, 2000

[54] METHOD FOR DESIGNING CELL ARRAY LAYOUT OF NON-VOLATILE MEMORY DEVICE

[75] Inventors: Jong-weon Yoo; Keon-soo Kim, both of Kyungki-do, Rep. of Korea

[73] Assignee: Samsung Electronics Co., Ltd.

[*] Notice: This patent issued on a continued prosecution application filed under 37 CFR 1.53(d), and is subject to the twenty year patent term provisions of 35 U.S.C. 154(a)(2).

[21] Appl. No.: 08/614,766

[22] Filed: Mar. 13, 1996

[30] Foreign Application Priority Data

Mar. 21, 1995 [KR] Rep. of Korea .................. 95-5981

[51] Int. Cl.$^7$ ...................................................... G06F 17/00
[52] U.S. Cl. ................................. 716/1; 716/19; 438/256; 438/587; 257/315; 257/316
[58] Field of Search ..................................... 364/488–491; 365/189.01, 185.08, 185.01, 185.28, 149, 185.16, 200; 257/315, 316; 438/256, 587

[56] References Cited

U.S. PATENT DOCUMENTS

| | | | |
|---|---|---|---|
| 5,183,781 | 2/1993 | Nakan | 437/191 |
| 5,317,534 | 5/1994 | Choi et al. | 365/182 |
| 5,326,999 | 7/1994 | Kim et al. | 275/315 |
| 5,379,233 | 1/1995 | Tripaohi et al. | 364/491 |
| 5,392,237 | 2/1995 | Iida | 365/185.16 |
| 5,426,608 | 6/1995 | Higashitani | 365/200 |
| 5,465,249 | 11/1995 | Cooper, Jr. et al. | 365/149 |
| 5,497,345 | 3/1996 | Cappelletti | 365/185.28 |
| 5,557,569 | 9/1996 | Smayling et al. | 365/185.28 |
| 5,640,031 | 6/1997 | Keshtbod | 257/315 |
| 5,656,527 | 8/1997 | Choi et al. | 438/258 |

*Primary Examiner*—Paul R. Lintz
*Assistant Examiner*—Vuthe Siek
*Attorney, Agent, or Firm*—Pillsbury Madison & Sutro LLP

[57] ABSTRACT

There is provided a method for designing a cell array layout of a non-volatile memory device which facilitates a contact hole process and contributes to the reduction of chip size, by modifying a layout of active contact holes. In the method, the distance between active regions are uniformly maintained in all cells by forming a second active line over a active contact region. Therefore, variations, caused by microloading effects when patterning active regions, of the width of active regions in some cell strings can be prevented. Operational failure of a cell caused by variations in the coupling ratio can be prevented, as well.

7 Claims, 5 Drawing Sheets

METHOD FOR DESIGNING CELL ARRAY LAYOUT OF NON-VOLATILE MEMORY DEVICE

BACKGROUND OF THE INVENTION

The present invention relates to a method for designing a cell array layout of a non-volatile memory device. More particularly, it relates to a method for designing a cell array layout of a non-volatile memory device, which facilitates formation of a contact hole and reduction of chip size by modifying the layout of an active contact hole for applying a voltage to the cell array.

A memory device for storing data has a great significance in a data processing system. Semiconductor, memory devices are largely grouped into volatile memory devices whose information is destroyed when power is interrupted and non-volatile memory devices whose information is retained despite the interruption of power. The non-volatile memory can be further categorized into two types: a read only memory (ROM) in which only the read-operation of input data can be performed, and an electrically erasable and programmable read only memory (EEPROM) in which input data can be electrically erased as well as entered. As a type of EEPROM, there is the flash EEPROM whose contents can be erased simultaneously.

Non-volatile memory generally employs a floating gate electrode and a control gate electrode, together. In this type of non-volatile memory, a floating gate is formed of a conductive material electrically insulated from the semiconductor substrate. The floating gate functions as a MOS transistor which senses the charge state. The storage of 1 or 0 is, therefore, determined by the presence or absence of charge in the floating gate. Injecting and removing charge into and from the floating gate relies on hot electrons generated by avalanche breakdown and F-N(Fowler Nordheim) tunneling effects.

FIG. 1 is a simplified view of a conventional cell array of a non-volatile memory device.

In FIG. 1 the string select transistor lines SSL1 and SSL2, and ground select transistor lines GSL1 and GSL2 are arranged in a predetermined direction (horizontally) in the upper and lower parts, respectively, and word lines W/L1–W/L$_n$ are arranged in parallel with select transistor lines SSL1, SSL2, GSL1 and GSL2. Memory cells having floating gates are connected in series between select transistor lines SSL1 and GSL1, constituting a string. Bit lines B/L1–B/L3 are arranged orthogonal to word lines W/L1–W/L$_n$ and connected to string select transistor lines SSL1 and SSL2 through bit line contact holes 1. A common source line C/S and common source contact holes 5 are arranged between ground select transistor lines GSL1 and GSL2.

When programming a cell 7 of the conventional nonvolatile memory device, a program voltage Vpgm of approximately 20V is applied to a control gate of cell 7 and a passing voltage Vpass of about 10V is applied to the control gates of the other unselected cells. This keeps the unselected cells connected to the control gate of the selected cell from being programmed. In other words, 0V is applied to bit line, (i.e. data line) B/L2 of a cell string having selected cell 7, a voltage Vcc to the other bit lines B/L1 and B/L3, a voltage Vpgm of about 20V to control gate W/Ln to which cell 7 belongs, a voltage Vpass of about 10V to the other unselected control gates W/L1–W/L$_{n-1}$, and a ground voltage or a voltage Vcc to the common source line C/S.

A conventional method for designing a memory cell array layout will now be described.

FIGS. 2, 3 and 4 are views for explaining the conventional method for designing a cell array layout of a non-volatile memory device. FIG. 2 is a conventional cell array layout view of the non-volatile memory device, FIG. 3 is a cross-sectional view along line a–a1 of FIG. 2, and FIG. 4 is a cross-sectional view along line b–b1 of FIG. 2.

As shown in FIGS. 2, 3 and 4, in the conventional cell, array layout of the non-volatile memory device, string select transistor lines SSL1 and SSL2, and ground select transistor lines GSL1 and GSL2 are arranged in a predetermined direction (horizontally) in the upper and lower parts, respectively. Word lines W/L1–W/L$_n$ and floating gates 9 are arranged in parallel with select transistor lines SSL1, SSL2, GSL1 and GSL2. Bit line contact holes 11 are arranged between select transistor lines SSL1 and SSL2, active source line 13 is arranged parallel to word lines W/L1–W/L$_n$, and active lines 15 are arranged orthogonal to active source line 13. A common source contact hole 17 is provided between regular cell strings, and connected to active lines 15.

A conventional NAND memory cell having a floating gate and a control gate needs common source contact hole 17 for applying a voltage to the substrate in which the cell array is placed. Common source contact hole 17, which is formed at the start of another cell string following a repetition of regular cell strings, exhibits the following problems in applications of the non-volatile memory device.

First, the growth speed of an oxide film increases in the oxidation of a large area of silicon rather than a relatively small area of silicon. Therefore, field oxide film 19 formed over a large area becomes thicker than another field oxide film 20 formed between adjacent cell strings, as shown in FIG. 3. Ground select transistor 29 constituted by floating gate 21, a dielectric film 23, and word line 25 is formed on field oxide film 19, thereby increasing the contact hole aspect ratio. Under this situation, the distance between word lines 25 must be maintained to be tl, as shown in FIG. 4. Thus, the conventional layout designing method imposes limitations upon reducing chip size.

As shown in FIGS. 2, 3 and 4, active lines 15 having common source contact hole 17 therebetween are formed apart from each other at a predetermined distance. When active-etching for defining an active region and a non-active region in a local oxidation of silicon (LOCOS) process, the etch rate difference caused by a microloading effect makes the width of silicon nitride films of both the cell strings spaced by common source contact hole 17 wider than those of adjacent cell strings. Namely, $W_2$ and $W_3$ are larger than $W_1$ and $W_4$ as shown in FIG. 3. This microloading effect also makes the width of active regions in cells formed in active lines adjacent to field oxide film 19 larger than that of the active regions in the cells formed in any other active line, thereby producing different coupling ratios. As a result, there is a high probability of programming failures.

SUMMARY OF THE INVENTION

The object of the present invention is to provide a method for designing a cell array layout of a non-volatile memory device, which can facilitate the contact hole formation process, prevent operation failure of a cell in a cell string adjacent to a common source contact hole, and contribute to the reduction of chip size by modifying a layout of the common source contact hole for applying a voltage to the cell array.

To achieve the above object, there is provided a method for designing a cell array layout in a non-volatile memory device having memory cells with floating gates, comprising the steps of:

arranging a plurality of bit lines to be connected to the drains of the memory cells;

arranging a plurality of word lines to be orthogonal to the bit lines so as to be used as the control gates of the memory cells;

arranging a source line to be connected to the sources of the memory cells, in parallel with the word lines;

arranging a plurality of first active lines to include the sources, drains and channels of the memory cells, in parallel with the bit lines;

arranging a plurality of first field separation lines between adjacent first active lines, in parallel with the first active lines;

arranging a second active line to be orthogonally connected to the source line, in parallel with the plurality of first active lines; and arranging a second field separation line between the second active line and a line of the first active lines adjacent thereto, in parallel with the first and second active lines.

The first and second field separation lines below the word lines are of the same width, and the source line for connecting the sources of memory cells may be formed of an impurity diffusion layer in an active region, or a conductive layer of polysilicon or stacked polysilicon and silicide.

According to another aspect of the present invention, there is provided a method for designing a cell array layout of a non-volatile memory device in which a string is comprised of a first select transistor and a second select transistor, and memory cells having floating gates therebetween, all connected in series, comprising the steps of:

arranging a plurality of bit lines to be connected to the drains of the first select transistors;

arranging a plurality of word lines to be used as the control gates of the memory cells, orthogonal to the bit lines;

arranging a first transistor select line to be used as the gates of the first select transistors, in parallel with the word lines;

arranging a source line to be connected to the sources of the second select transistors, in parallel with the word lines;

arranging a second transistor select line to be used as the gates of the second select transistors, in parallel with the word lines;

arranging a plurality of first active lines to include the memory cells and the sources, drains, and channels of the select transistors, in parallel with the bit lines;

arranging a plurality of first field separation lines between adjacent first active lines, in parallel with the first active lines;

arranging a second active line to be orthogonally connected to the source line, in parallel with the plurality of first active lines; and arranging a second field separation line between the second active line and a line of the first active lines adjacent thereto, in parallel with the first and second active lines.

The first and second field separation lines below the plurality of word lines are formed to be of the same width, and the source line for connecting the sources of the second select transistors may be formed of an impurity diffusion layer on an active region, or a conductive layer of polysilicon or stacked polysilicon and silicide.

According to the present invention, operation failure of a cell caused by coupling ratio difference can be prevented since the width of active regions in the whole cells can be uniformly maintained, with the introduction of the second active line.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE EMBODIMENT

Figure 5:
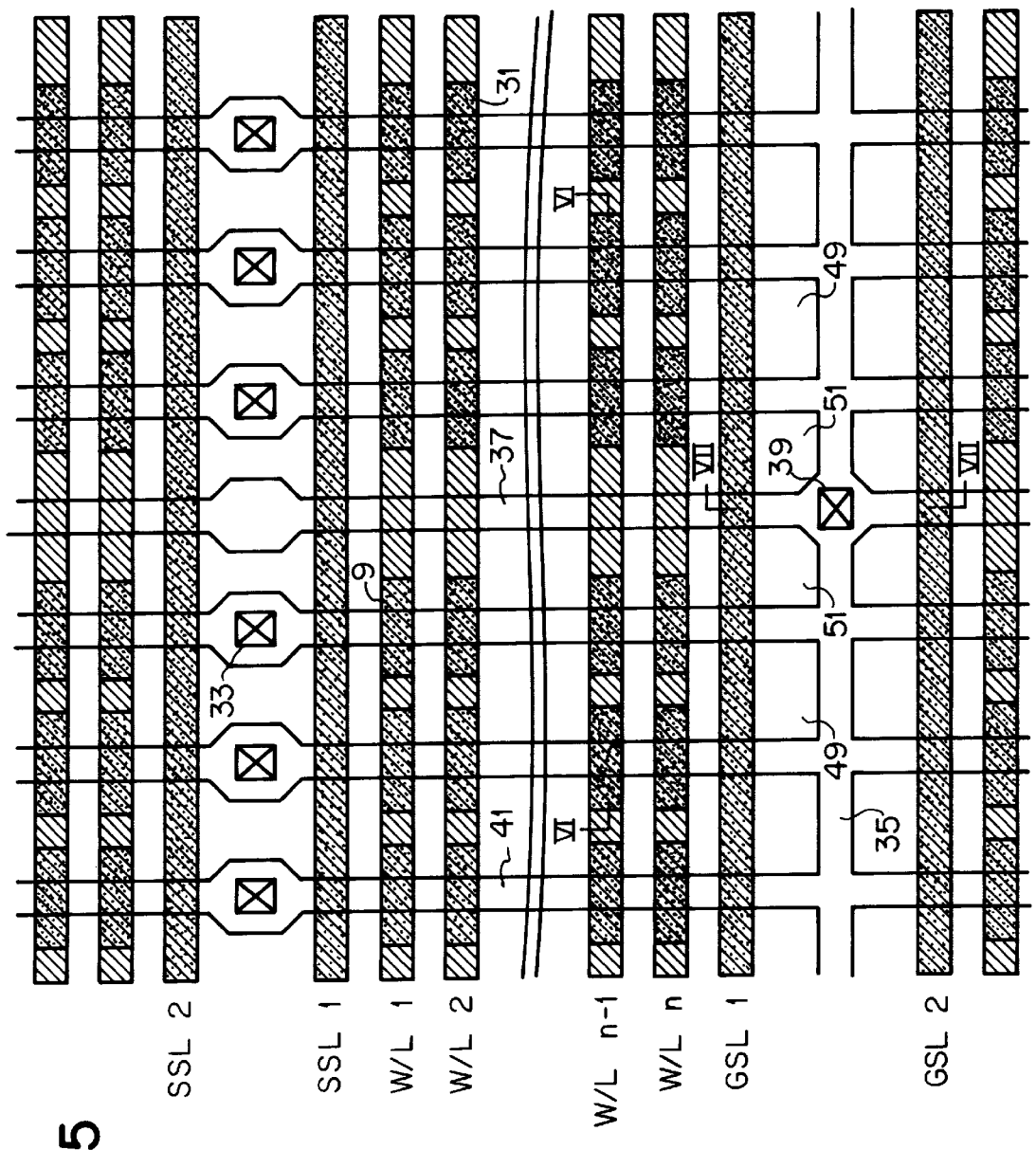
FIGS. 5, 6 and 7 are views for explaining a method for designing a cell array layout of a non-volatile memory device according to the present invention.
Figure 6:
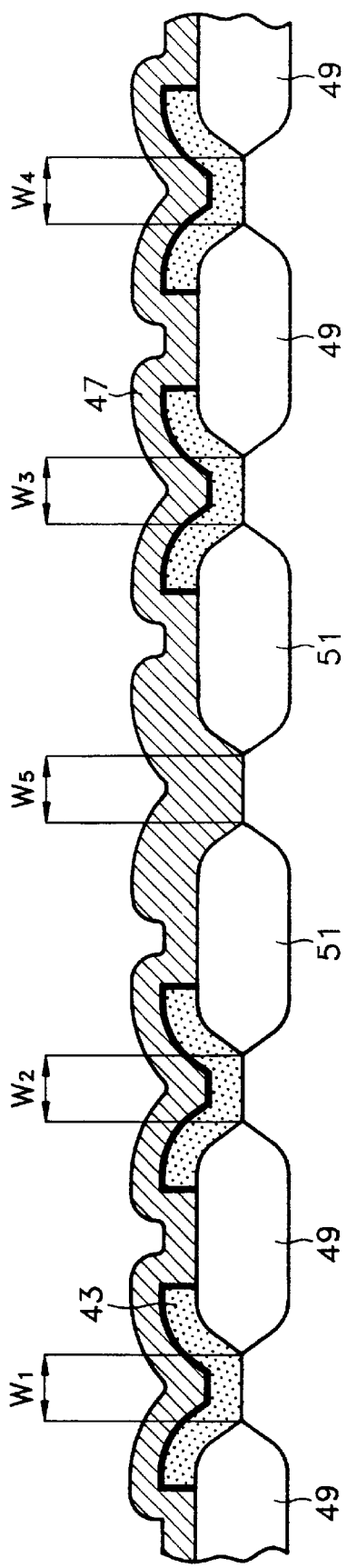
Figure 7:
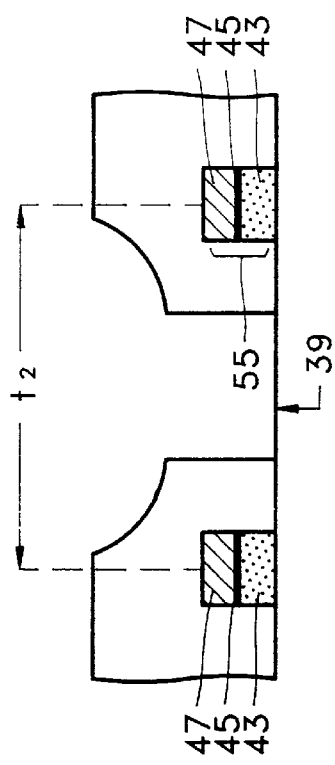

FIG. 5 is a layout view of the cell array of the nonvolatile memory device according to the present invention, FIG. 6 is a cross-sectional view along line a–a1 of FIG. 5, and FIG. 7 is a cross-sectional view along line b–b1 of FIG. 5.

As shown in to FIGS. 5, 6 and 7, in the layout of the cell array of the non-volatile memory device, string select transistor lines SSL1 and SSL2, and ground select transistor lines GSL1 and GSL2 are arranged in a predetermined direction (horizontally) in the upper and lower parts, respectively. Word lines $W/L1-W/L_n$ and floating gates 31 are arranged in parallel with the select transistor lines SSL1, SSL2, GSL1 and GSL2. Bit line contact holes 33 are arranged between select transistor lines SSL1 and SSL2, and source line 35 is placed in parallel with word line W/L1–W/Ln. A main source line (not shown) is arranged orthogonal to source line 35 and connected thereto through a common source contact hole 39. In addition, common source contact hole, i.e. active contact hole, 39 is placed between regular cell strings and connected to source line 35. In FIGS. 6 and 7, reference numerals 43, 45 and 47 denote a floating gate, a dielectric film, and a word line, respectively.

The present invention provides for the connection of the main source line to source line 35 through common source contact hole 39. A plurality of first active lines 41 are arranged below the bit lines (not shown) and in parallel therewith, including the memory cells and the sources, drains and channels of the select transistors. Also provided are: first field separation lines 49, between adjacent first active lines 41 and in parallel therewith; a second active line 37, below the main source line, in parallel therewith and connected orthogonally to source line 35; and a second field separation line 51, between first active line 41 and second active line 37, in parallel therewith.

Figure 1:
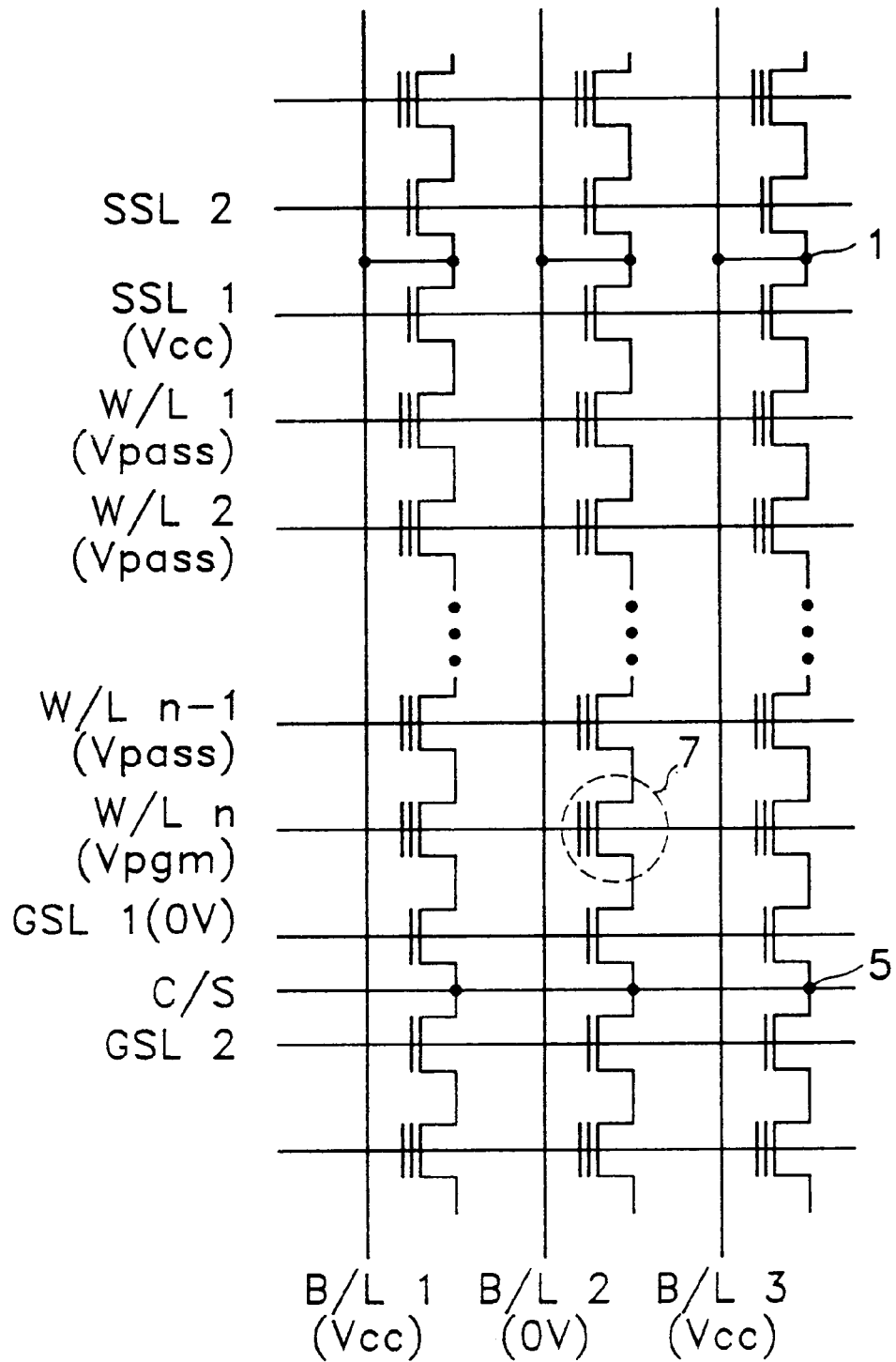
FIG. 1 is a simplified view of a conventional cell array of a non-volatile memory device.
Figure 2:
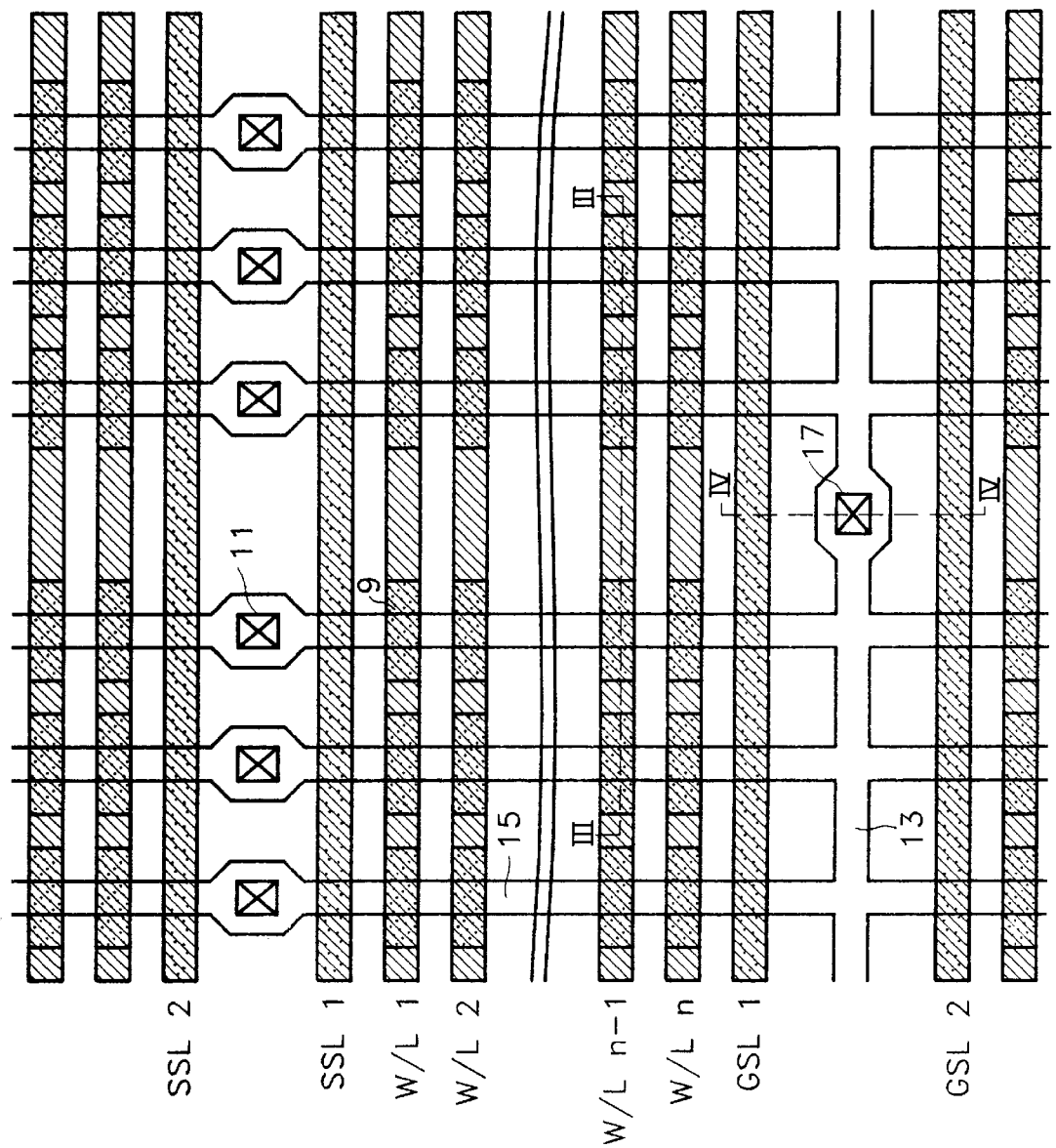
FIGS. 2, 3 and 4 are views for explaining a conventional method for designing a cell array layout of the non-volatile memory device.
Figure 3:
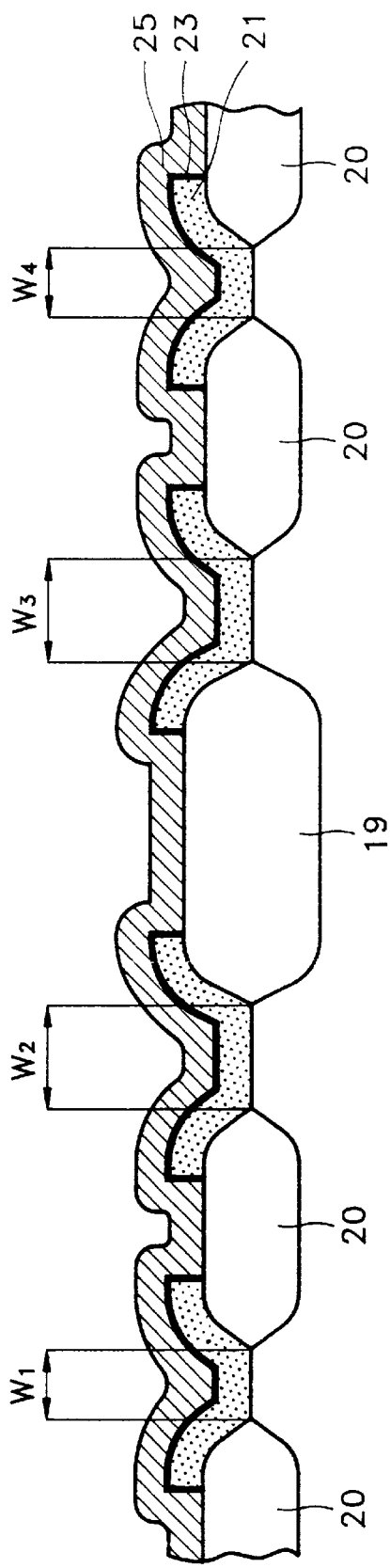

In the layout shown in FIG. 6, $W_2$ and $W_3$ can be as large as the width of any other active region. In contrast, as shown in FIG. 3, $W_2$ and $W_3$ are larger than $W_1$ and $W_4$ in the conventional layout.

Accordingly, in the present invention $W_2$ and $W_3$ can be as large as the width of any other active region obtained due to $W_5$, as shown in FIG. 6.

Figure 4:
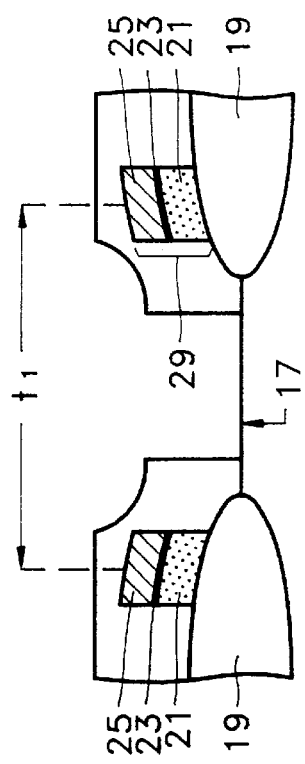

As shown in FIG. 7, the aspect ratio of common source contact hole 39 can be decreased. In the conventional layout, since the aspect ratio is seriously deteriorated due, to ground select transistors 29, i.e., GSL1 and GSL2, formed on field oxide films 19, as shown in FIG. 4, the aspect ratio of common source contact hole 17 worsens. To solve this problem, a predetermined distance t1 must be maintained. On the other hand, in the present invention, ground select transistors 55, i.e., GSL1 and GSL2, are formed on active regions allowing t2 to be smaller than tl, thereby contributing to the reduction of chip size. Further, the etching process for forming the contact hole can be simplified due to the reduced aspect ratio of the field oxide.

In the present invention, variations, in the width of active regions in some cell strings caused by microloading effects when patterning active regions, can be prevented since the distance between active regions are uniformly maintained in all cells by connecting active regions for forming common source contact holes with a second active line equal to a cell string. Further, the aspect ratio of the contact hole, in the present invention considerably decreases, since ground transistor lines GSL1 and GSL2 run over the second active line.

As described above, the method for designing a cell array layout of a non-volatile memory facilitates the contact hole formation process by improving the layout of an active contact hole for applying a voltage to the cell array, and contributes to reduction of chip size by reducing the distance between the active contact hole and a gate adjacent thereto.

In addition, operational failure of a cell caused by variations in the coupling ratio can be prevented, since the use of the second active line reduces microloading effects, thereby, uniformly maintaining the width of an active region in all cells.

The present invention is not restricted to the above embodiment, and it is clearly understood that many variations can be possible within the scope and spirit of the present invention by anyone skilled in the art.

What is claimed is:

1. A method for designing a cell array layout in a non-volatile memory device comprised of memory cells having floating gates, comprising the steps of:
   arranging a plurality of bit lines to be connected to drains of said memory cells;
   arranging a plurality of word lines to be orthogonal to said bit lines so as to be used as control gates of said memory cells;
   arranging a source line to be connected to sources of said memory cells, in parallel with said word lines;
   arranging a plurality of active lines to include the sources, drains and channels of said memory cells, in parallel with said bit lines;
   arranging a dummy active line to be orthogonally connected to said source line, in parallel with said plurality of active lines;
   arranging a plurality of field separation lines below said word lines;
   arranging a plurality of ground select transistors and string select transistors in parallel with said word lines on said active and dummy active lines; and
   arranging a common source contact at a crossing point intersecting said dummy active line and said source line, said dummy active line and said source line being orthogonal to one another, wherein arranging common source contact at said crossing point intersecting said dummy active line and said source line reduces the height of the ground select lines formed adjacent to the common source contact and reduces the aspect ratio of a contact hole.

2. A method for designing a cell array layout in a nonvolatile memory device as claimed in claim 1, said source line for connecting the sources of said memory cells being formed of an impurity diffusion layer in an active region.

3. A method for designing a cell array layout in a non-volatile memory device as claimed in claim 1, said source line for connecting the sources of said memory cells being formed of a conductive layer of polysilicon or a conductive layer of stacked polysilicon and silicide.

4. A method for designing a cell array layout of a non-volatile memory device in which each of a plurality of strings is comprised of a select transistor and a ground select transistor, and memory cells having floating gates therebetween, all connected in series, the method comprising the steps of:
   arranging a plurality of bit lines to be connected to drains of said select transistors;
   arranging a plurality of word lines to be used as control gates of said memory cells, orthogonal to said bit lines;
   arranging a transistor select line to be used as gates of said select transistors, in parallel with said word lines;
   arranging a source line to be connected to sources of said ground select transistors, in parallel with said word lines;
   arranging a ground transistor select line to be used as gates of said ground select transistors, in parallel with said word lines;
   arranging a plurality of active lines to include memory cells and the sources, drains, and channels of said select transistors in parallel with said bit lines;
   arranging a dummy active line to be orthogonally connected to said source line, in parallel with said plurality of active lines;
   arranging a plurality of field separation lines below said plurality of word lines; and
   arranging a common source contact at a crossing point intersecting said dummy active line and said source line, said dummy active line and said source line being orthogonal to one another, wherein arranging said common source at said crossing point intersecting said dummy active line and said source line reduced the height of the ground select lines formed adjacent to the common source contact and reduces the aspect ratio of a contact hole.

5. A method for designing a cell array layout of a nonvolatile memory device as claimed in claim 4, said source line for connecting the sources of said ground select transistors being formed of an impurity diffusion layer on an active region.

6. A method for designing a cell array layout of a non-volatile memory device as claimed in claim 5, said source line for connecting the sources of said ground select transistors being formed of a conductive layer of polysilicon or a conductive layer of stacked polysilicon and silicide.

7. A method for designing a cell array layout of a non-volatile memory device having a plurality of cell strings, each of said strings being comprised of a series connection of a select transistor coupled to a select line, a plurality of memory sells respectively coupled to a plurality of word lines, and a ground select transistor coupled to a ground select line, each of said cell strings being commonly coupled to a source line said method comprising the steps of:
   arranging said select line in a first direction;
   arranging said plurality of word lines adjacent to and spaced from said select line in said first direction;

arranging a ground select line adjacent to and spaced from said plurality of word lines in said first direction;

arranging said source line adjacent to and spaced from said ground select line in said first direction;

defining a group of cell strings in a first area where said select and ground lines, said word lines, and said source lines are arranged, said step of defining said first group of cell strings including:

arranging a first plurality of active lines in a second direction orthogonal to said first direction, each of said plurality of active lines being associated with a respective one of said first cell strings, and arranging a fist plurality of field separation lines in said second direction between adjacent active lines;

defining a second group of cell strings in a second area different Than said first area where said select and ground select lines, said word lines, and said source line are arranged, said step of defining said second group of cell strings including:

arranging a second plurality of active lines in said second direction, each of said second plurality of active lines being associated with a respective one of said second cell strings, and arranging a second plurality of field separation lines in said second direction between adjacent active lines;

arranging a dummy active line in said second direction between said first and second groups of cell strings;

arranging a common source contact hole where said source line and said dummy active line intersect, said dummy active line and said source line being orthogonal to one another, wherein arranging said common source contact hole at said crossing point intersecting said dummy active line and said source line the height of the ground select lines formed adjacent to the common source contact and reduces the aspect ratio of the contact hole; and arranging a second plurality of field separation lines between said dummy active line and adjacent ones of said first and second pluralities of active lines.

* * * * *